United States Patent [19]

Sheng et al.

[11] Patent Number: 5,981,404
[45] Date of Patent: Nov. 9, 1999

[54] MULTILAYER ONO STRUCTURE

[75] Inventors: Yi Chung Sheng, Taichung; Yi Chih Lim, Hsin-Chu; Ming Hua Liu, Taichung; Ming-Tzong Yang, Hsin-Chu, all of Taiwan

[73] Assignee: United Microelectronics Corp., Taiwan

[21] Appl. No.: 08/857,734

[22] Filed: May 16, 1997

Related U.S. Application Data

[60] Provisional application No. 60/031,670, Nov. 22, 1996.

[51] Int. Cl.⁶ ................................................ H01L 29/68
[52] U.S. Cl. .......................................... 438/791; 438/954
[58] Field of Search ................................... 438/791, 954, 438/787

[56] References Cited

U.S. PATENT DOCUMENTS

| | | | |
|---|---|---|---|
| 4,827,325 | 5/1989 | Or-Bach et al. | 357/54 |
| 5,304,829 | 4/1994 | Mori et al. | 257/324 |
| 5,397,748 | 3/1995 | Watanabe et al. | 437/239 |
| 5,670,431 | 9/1997 | Huanga et al. | 437/241 |
| 5,729,035 | 3/1998 | Anma | 257/324 |

OTHER PUBLICATIONS

Ohnishi, et al., "Ultrathin Oxide/Nitride/Oxide/Nitride Multilayer Films for Mbit DRAM Capacitors," Solid State Devices & Materials Extended Abstracts of 1992 International Conferences. Sep., 1992. pp. 67–69.

Primary Examiner—Charles Bowers
Assistant Examiner—Martin Sulsky
Attorney, Agent, or Firm—Rabin & Champagne, P.C.

[57] ABSTRACT

Dielectric structures of the type that might be used in DRAMs, other memory devices, and integrated thin film transistors include repeated silicon oxide/silicon nitride layers. For example, the dielectric structure may have a silicon oxide/silicon nitride/silicon oxide/silicon nitride/silicon oxide or "ONONO" layer structure. Such repeated layer structures exhibit higher levels of breakdown voltage than more conventional "ONO" structures. Most of the growth of the five layer ONONO or more complicated dielectric structure can be accomplished in a single furnace through a series of temperature steps performed under different gas ambients. A substrate having a polysilicon lower electrode is introduced to a furnace and a lowest layer of silicon oxide is grown on the polysilicon electrode in an ammonia ambient. A first silicon nitride layer is grown in $NH_3$ and $SiH_2Cl_2$ and then growth of the first silicon nitride layer is interrupted by first altering or stopping the flow of reaction gases and then growing an intermediate silicon oxide layer on the first silicon nitride layer, again in an ammonia ambient. A second silicon nitride layer is then formed by reintroducing the same combination of processing gases. Growth of the second silicon nitride layer is then interrupted, and either additional repetitions of the silicon oxide/silicon nitride layer structure are formed or a surface layer of silicon oxide is grown in a steam or wet oxygen ambient.

7 Claims, 4 Drawing Sheets ial undergoes dielectric breakdown. Both charge leakage
MULTILAYER ONO STRUCTURE This application claims priority from provisional application Ser. No. 60/031,670, filed Nov. 22, 1996.

BACKGROUND OF THE INVENTION

1. Field of the Invention

The present invention relates to thin dielectric layers used in integrated circuit devices such as the dielectric layers provided between electrodes of charge storage capacitors used in some integrated circuit devices.

2. Description of the Related Art

Integrated circuit memory devices often include capacitors which are charged to different levels to represent stored data. For example, dynamic random access memories (DRAMs) typically consist of an array of memory cells with each memory cell including a charge storage capacitor connected to one source/drain region of a transfer field effect transistor (FET). One or another of two different charge levels is provided on the electrodes of the charge storage capacitor to represent either a logical one or zero stored in the memory cell. The transfer FET acts as a switch for selectively coupling a terminal electrode of the charge storage capacitor to data lines and other circuitry during data reading or writing operations.

DRAM charge storage capacitors consist of two electrodes separated by a layer of dielectric material. Most often, at least the surfaces of the electrodes that are in contact with the layer of dielectric material are doped polysilicon. The lower electrode or terminal of the charge storage capacitor is most often a polysilicon structure having a lower surface formed in contact with a source/drain region of the transfer FET. Often, portions of the lower electrode extend onto an insulating layer formed over other portions of the transfer FET and adjacent other portions of the DRAM. The lower capacitor electrode might have a planar surface, but more commonly the lower electrode has a surface with a more complicated shape including, for example, one or more fins extending from a base part of the electrode. Whether or not the lower electrode of the capacitor has such a complicated shape, the upper electrode of the capacitor is made so that its surface is in close, spaced parallel relationship to the surface of the lower electrode. Such a close, spaced parallel relationship is easily provided by first forming a thin dielectric layer over the surface of the lower electrode and then conformally depositing the upper electrode onto the dielectric layer.

It is almost always desirable for charge storage capacitors to be capable of high levels of charge storage, i.e., charge storage capacitors preferably have comparatively high levels of capacitance. Capacitance is determined in part by the distance separating the upper and lower electrodes that make up the charge storage capacitor. Since the upper electrode is separated from the lower electrode by the dielectric layer, the spacing between the upper and lower electrodes is typically determined by the thickness of the dielectric layer. Another factor affecting capacitance is the dielectric constant of the layer of dielectric material which separates the electrodes of the charge storage capacitor. Use of higher dielectric constant materials as the capacitor dielectric increases the amount of charge that can be stored on the charge storage capacitor.

Other characteristics of capacitor performance, less directly related to capacitance, are also affected by the particular material chosen for the dielectric layer within the capacitor. These include both the rate at which charge leaks across the layer of dielectric material in a given implementation and the breakdown voltage, that is, the voltage applied across the capacitor electrodes at which the dielectric material undergoes dielectric breakdown. Both charge leakage and breakdown voltage are factors not only of the particular material chosen, but also of the quality of the films of that material that can be formed and used compatibly with high volume manufacturing processes. For example, if a thin layer of a given capacitor dielectric material cannot be formed without pinholes of the type associated with charge leakage, then that dielectric material may be undesirable for use in capacitors. Similarly, if a given capacitor dielectric material has a low breakdown voltage, then the capacitor dielectric material may only be suited for use in low operating voltage applications.

One commonly used dielectric for DRAM charge storage capacitors consists of a three layer structure of a first layer of silicon oxide, a middle layer of silicon nitride and a second or upper layer of silicon oxide on the other side of the silicon nitride layer. This dielectric structure is commonly referred to as "ONO". Most of the thickness of the ONO structure consists of the middle silicon nitride layer so that the ONO structure has a dielectric constant largely determined by the comparatively high dielectric constant of the silicon nitride. The effective dielectric constant of the structure is reduced by the lower dielectric constant of the oxide layers which are capacitively in series with the silicon nitride layer. Typically, the lower layer of silicon oxide is a native oxide on the surface of the polysilicon of the lower capacitor electrode which is difficult to eliminate. The upper layer of silicon oxide is formed to provide a better surface for the deposition of the polysilicon layer of the upper electrode than is provided by the silicon nitride layer.

ONO dielectric layers are typically grown on N-type polysilicon lower electrodes of DRAM charge storage capacitors through a series of thermal processing steps performed in different gas ambients. Various types of thermal reaction furnaces might be used for growing the ONO dielectric structure. Substrates ready for dielectric formation have undergone a series of processing steps including the formation of an array of transfer FETs and a corresponding array of doped polysilicon lower electrodes. Prior to growing the dielectric layer, the substrates, typically silicon wafers, are held adjacent the reaction chamber and the chamber reaches a temperature of about 400° C. in a nitrogen ($N_2$) ambient. One or more substrates are then moved into the reaction chamber, and the temperature is ramped up to 700° C. while still maintaining the nitrogen ambient. A layer of thermal oxide of about 12–18 Å grows on the surface of the polysilicon lower electrode during the processing steps up to this point. After the temperature has stabilized at 700° C., a mixture of $NH_3$ (180 sccm) and $SiH_2Cl_2$ (36 sccm) flows into the reaction chamber at a pressure of about 100 mTorr. This process is continued to grow a silicon nitride layer of the desired thickness, typically 40–80 Å, and the gas flow is stopped. Next, the temperature is ramped down from 700° C. to a temperature of about 400° C. in a nitrogen ambient and then the substrate is removed from the reaction chamber. The substrate is then placed in another reaction chamber and heated to a temperature of about 850° C. for 15–30 minutes in a steam or wet $O_2$ environment to grow a surface layer of silicon oxide. The silicon oxide layer formed on the surface of the silicon nitride layer is thin due to the difficulty in oxidizing the surface of silicon nitride.

The lower layer of silicon oxide in ONO dielectric films is undesirable for a number of reasons. Due to the lower dielectric constant of silicon oxide as compared to silicon nitride, the presence of the silicon oxide in series with the silicon nitride layer acts to reduce the capacitance of the capacitor. Furthermore, the thickness of the lower silicon oxide layer is variable and difficult to control. Variations in the thickness of the silicon oxide layer can result in undesirable variations in device performance. Accordingly, it is desirable to provide a more reliable and predictable dielectric for capacitors in integrated circuits.

As DRAM cell density increases, it is necessary to form DRAM capacitors having reduced dimensions while still retaining an acceptable level of capacitance. One method of maintaining the desired level of capacitance is to use thinner capacitor dielectric films. There is considerable difficulty, however, in forming ONO dielectric films as thin as is desirable for reduced dimension DRAM charge storage capacitors. In addition, thin ONO films have undesirably low breakdown voltages for such reduced dimension charge storage capacitors. More reliable thin dielectric films are therefore desirable for DRAM capacitors. It would be desirable to utilize materials having higher a dielectric constant for the DRAM capacitor dielectric, but such materials remain unpredictable and unreliable.

SUMMARY OF THE PREFERRED EMBODIMENTS

It is therefore an object of the present invention to form capacitor dielectric films that are better suited to use in reduced dimension charge storage capacitors.

One aspect of the present invention includes an integrated circuit having a first electrode, a second electrode and a dielectric structure separating the first and second electrodes. The dielectric structure includes a first silicon nitride layer adjacent the first electrode, an intermediate layer of silicon oxide between the first silicon nitride layer and the second electrode and a second silicon nitride layer over the intermediate silicon oxide layer between the intermediate silicon oxide layer and the second electrode.

A more detailed embodiment of the invention provides an integrated circuit device having a first electrode with a doped polysilicon surface and a lower silicon oxide layer on the first electrode. A first layer of silicon nitride is formed on the surface of the lower silicon oxide layer, an intermediate silicon oxide layer is formed on the intermediate silicon oxide layer, a second silicon nitride layer is formed on the intermediate silicon oxide layer, and a surface layer of silicon oxide is provided between the second silicon nitride layer and the second electrode.

Another aspect of the present invention provides a method of manufacturing an integrated circuit device including a dielectric structure. The method includes growing a first silicon nitride layer on an exposed surface of a first electrode and then interrupting the growth of the first silicon nitride layer by altering the growth conditions within the processing chamber. Silicon nitride growth is reinitiated to grow a second silicon nitride layer. A second electrode is then provided over the second silicon layer. In a particular embodiment, the growth of the first silicon nitride layer can be interrupted by altering the gas ambient within the processing chamber to stop silicon nitride growth, growing a silicon oxide layer over the first silicon nitride layer and then growing the second silicon nitride layer on the silicon oxide layer.

DETAILED DESCRIPTION OF THE PREFERRED EMBODIMENTS

Figure 1:
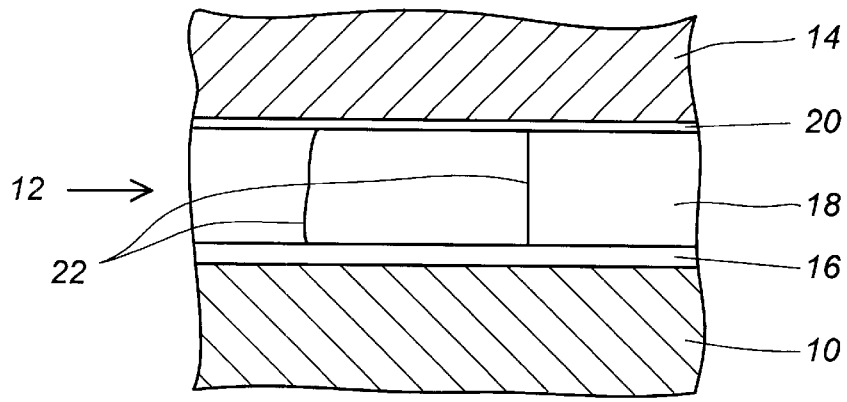
FIG. 1 illustrates an ONO capacitor dielectric and defect structures that exist in the dielectric layer.

Embodiments of the present invention provide a dielectric film suitable for use in, for example, DRAM charge storage capacitors. Embodiments of the present invention might also be incorporated within other memories such as EEPROMS, flash EEPROMS, SRAMs or other integrated circuits which utilize thin dielectric layers to separate conductors. Preferred embodiments of the invention provide a dielectric film including a repeated ONO layer structure such as a five layer "ONONO" film consisting of a first layer of silicon oxide, a first layer of silicon nitride, a second layer of silicon oxide, a second layer of silicon nitride and a third, surface layer of silicon oxide. Each of the two silicon nitride layers in the five layer structure is preferably made thinner than the single silicon nitride layer used in the conventional ONO structure. Alternate embodiments of the present invention might provide additional repetitions of the fundamental silicon nitride/silicon oxide layer structure, for example, by forming the seven layer structure: "ONONONO".

The present inventors have observed that the silicon nitride middle layers of conventional ONO dielectric layers may include defect structures which extend through the entire thickness of the silicon nitride layers. An example of this is illustrated schematically in FIG. 1, which shows a lower doped polysilicon electrode 10, an ONO dielectric layer 12 and an upper doped polysilicon electrode 14. ONO layer 12 includes a layer of native oxide layer 16 formed on the surface of the lower polysilicon electrode 10, a middle silicon nitride layer 18 formed on the surface of oxide layer 16, and a silicon oxide layer 20 grown on the surface of silicon nitride layer 18. Defect structures 22, similar to dislocations, extend through the silicon nitride layer 18. The present inventors believe that the defect structures 22 locally reduce the breakdown voltage across the silicon nitride layer and thereby reduce the breakdown voltage of the entire film.

Figure 2:
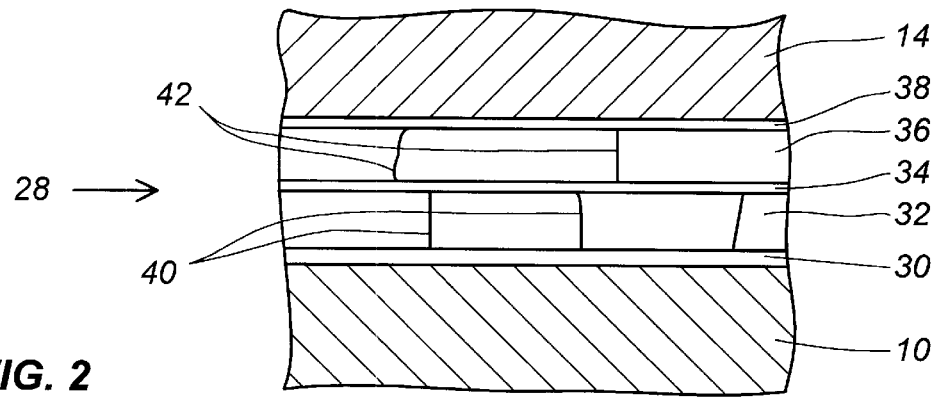
FIG. 2 illustrates an ONONO capacitor dielectric in accordance with the present invention and illustrates defect structures in such a dielectric layer.

A dielectric layer having a repeated ONO structure, such as a five layer ONONO structure, should have a significantly reduced number of defect structures that extend directly through most or all of the dielectric layer. FIG. 2 illustrates an ONONO dielectric layer 28 provided between a lower doped polysilicon electrode 10 and an upper doped polysilicon electrode 14. The five layer ONONO dielectric layer 28 includes a lowest native oxide layer 30, first silicon nitride layer 32, intermediate silicon oxide layer 34, second silicon nitride layer 36, and surface silicon oxide layer 38.

Defect structures 40 may form in the first silicon nitride layer 32 in the same manner in which the defect structures 22 are formed in the ONO structure of FIG. 1. The ONONO structure illustrated in FIG. 2 is formed on a lower doped polysilicon electrode 10 covered by what is typically a native silicon oxide layer 30. It may be desirable to eliminate the native oxide layer 30 from the polysilicon surface of electrode 10, but it may be difficult or impractical to avoid forming a native oxide layer 30 on the electrode surface. Accordingly, the more preferred strategy is to minimize the thickness of native oxide layer 30. Formation of the ONONO structure proceeds by growing a first silicon nitride layer 32 on oxide layer 30 and then interrupting the growth of the first silicon nitride layer 32. Most often, the growth of the first silicon nitride layer 32 is interrupted by altering the gas ambient within the furnace. Under preferred conditions, a thin layer of an insulator distinct from silicon nitride will be provided on the surface of the first silicon nitride layer. Preferably, a silicon oxide layer 34 is grown on the silicon nitride layer 32 and then the second silicon nitride layer 36 is grown on silicon oxide layer 34. In this manner, the second silicon nitride layer 36 grows independently of the first silicon nitride layer 32 so that defect structures 42 that might be formed in the second silicon nitride layer 36 are formed independently of the defect structures 40 formed in the first silicon nitride layer 32. As illustrated in FIG. 2, forming distinct nitride layers within the dielectric structure results in a much reduced likelihood of defect structures extending completely through both of the silicon nitride layers. Since fewer defect structures extend entirely through the dielectric layer 28, the dielectric layer exhibits an improved breakdown voltage.

Figure 3:
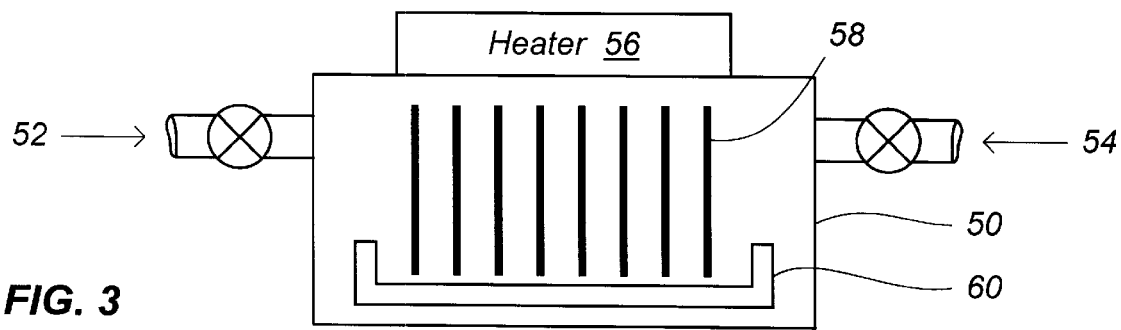
FIG. 3 schematically illustrates a furnace for growing silicon oxide and silicon nitride films.

This specification now describes in greater detail the formation of dielectric layers in accordance with preferred embodiments of the present invention. FIG. 3 schematically illustrates a furnace 50 that might be used in growing oxide and nitride films on silicon wafers or other substrates on which dielectric layers are to be formed. The design and operation of such furnaces are conventional and so will not be described herein. Furnace 50 is provided with one or more gas feeds 52 for providing reaction and other ambient gases to the furnace chamber. Chamber pressure is maintained by pumping through vacuum port 54. A heater 56, typically operating under computer control, maintains the chamber at desired temperatures and alters the temperature of the chamber in a controlled manner. One or more substrates 58 are loaded onto a carrier or boat 60 for transport into and out of the furnace. The substrates may be, for example, silicon wafers at a intermediate stage of DRAM manufacture in which lower capacitor electrodes have been formed from doped polysilicon in contact with the appropriate source/drain regions of transfer FETs formed in and on the silicon wafers.

Dielectric layers are formed on the exposed polysilicon surfaces of the lower electrodes by heating the substrates to different temperatures under different gas ambients. The ONONO film illustrated in FIG. 2 can be formed in the process illustrated schematically in FIG. 4. Substrates enter the furnace chamber 50 at a preheat temperature of 400° C. and then the furnace temperature is ramped up to a nitride deposition temperature of 670° C. in $NH_3$ gas flowing at a rate, for example, of 1000 sccm and with a furnace pressure of about 1.2 Torr. The $NH_3$ purge may be discontinued at about the time when the furnace reaches 670° C., with a flow of nitrogen ($N_2$) gas provided in place of the $NH_3$ purge. Alternately, the substrates can be maintained in a nitrogen ambient during the temperature ramp and then the $NH_3$ purge can be performed after the furnace and substrates have stabilized at 670° C. (not shown). The result of either process is that a thin native oxide film 30 is provided on the surface of the polysilicon 10. Regardless of the gas ambient within the furnace, there is commonly residual oxygen in the furnace chamber so that, in the absence of gettering gases or of ambient gases which contribute to competing growth mechanisms, oxide will naturally grow on the surface of the polysilicon electrode 10. The native oxide films produced in the illustrated $NH_3$ process are typically thinner and of a more uniform thickness than the native oxide films 16 grown under the nitrogen ambient typical of conventional ONO processes. The more uniform and thinner silicon oxide layer 30 produced in the $NH_3$ process of FIG. 4 increases the effective dielectric constant and reliability of ONO and other films which incorporate an oxide layer formed under an $NH_3$ ambient.

After the temperature has stabilized at 670° C., the flow of nitrogen gas is stopped and a mixture of $NH_3$ (180 sccm) and $SiH_2Cl_2$ (18 sccm) is provided to the furnace chamber and the chamber is maintained at a pressure of about 100 mTorr to grow a first silicon nitride layer 32. Silicon nitride layer 32 is grown to a target thickness, typically about 20–30 Å, depending on the total number of silicon nitride layers to be incorporated within the dielectric structure. The thickness of each of the silicon nitride layers is selected according to the desired total thickness and capacitance of the capacitor dielectric layer. Growth of the first silicon nitride layer 32 is then interrupted by stopping the previous gas flow with an introduction of nitrogen gas and then the chamber is purged with a flow of $NH_3$ at a rate of 180 sccm and a pressure chamber of 100 mTorr. During this interruption, a thin intermediate layer of silicon oxide 34 is preferably provided on the first layer of silicon nitride 32. It is particularly preferred that the interruption of the growth of the first silicon nitride layer, including the growth of the intermediate silicon oxide layer 34, be sufficient so that the second silicon nitride layer grows independently of the first silicon nitride layer. In this regard, independent growth means that any defect structures formed in the second silicon nitride layer are distributed randomly within the second silicon nitride layer with little or, more preferably, no correlation to the defect structures in the first silicon nitride layer. After a sufficiently thick silicon oxide layer 34 is grown, the purge is stopped with a flow of nitrogen gas and the gas flow to the chamber is then returned to the mixture of $NH_3$ (180 sccm) and $SiH_2Cl_2$ (18 sccm) at a chamber pressure of about 100 mTorr used for growing silicon nitride. The temperature is maintained at 670° C. for the deposition of the second silicon nitride layer 36 to its desired thickness, about 20–30 Å, depending on the characteristics desired for the dielectric layer being formed.

Figure 5:
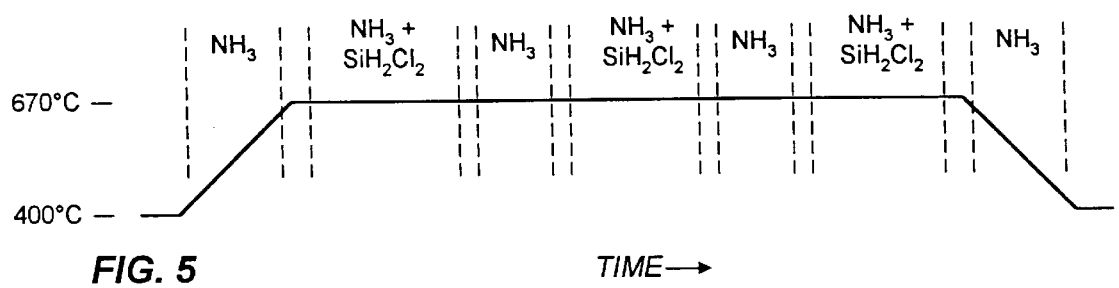
FIG. 5 schematically illustrates a series of processing steps that may be used in the formation of an ONONONO dielectric structure.
Figure 6:
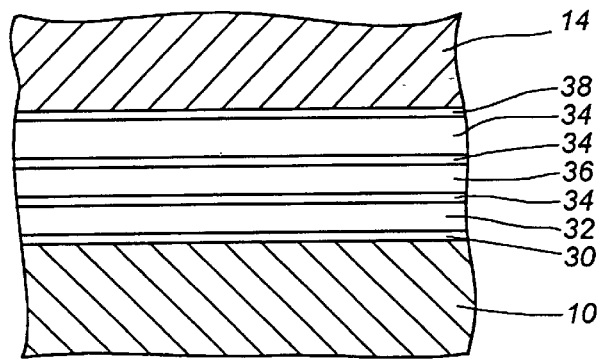
FIG. 6 illustrates an ONONONO dielectric structure formed in accordance with the method illustrated in FIG. 5.

After the second silicon nitride layer is formed in the illustrated ONONO embodiment, the chamber is purged with nitrogen flowing at 180 sccm and then the chamber temperature is ramped down from 670° C. to a temperature of about 400° C. and the substrates 58 are removed from the furnace. A surface layer of silicon oxide 38 is typically formed by another thermal process in which the substrates are heated to a temperature of about 850° C. for 15–30 minutes in a steam or wet $O_2$ environment, generally in a different furnace. Further processing may then be performed to complete the electrode structure including, for example, providing a layer of doped polysilicon on the ONONO structure to form an upper capacitor electrode. It might alternately be desirable to form a dielectric layer having additional "NO" sequences, such as a seven layer ONON- ONO dielectric structure, to obtain further improvements in the dielectric's defect structures and breakdown voltage. Such additional sequences would typically include more numerous but thinner silicon nitride layers so that the total thickness of the dielectric structure remains at the desired level. To form additional sequences of NO, the silicon nitride deposition can be more frequently interrupted by altering the gas flow and purging with $NH_3$ to grow additional thin oxide layers on each successive silicon nitride layer. A suitable sequence of heating steps in different gas ambients for forming an ONONONO structure is schematically illustrated in FIG. 5 and the resulting structure is shown in FIG. 6. Like numerals are used in FIG. 6 to identify structures which are essentially the same, with the exception of layer thickness, as like numbered structures in the FIG. 2 ONONO dielectric structure.

Figure 4:
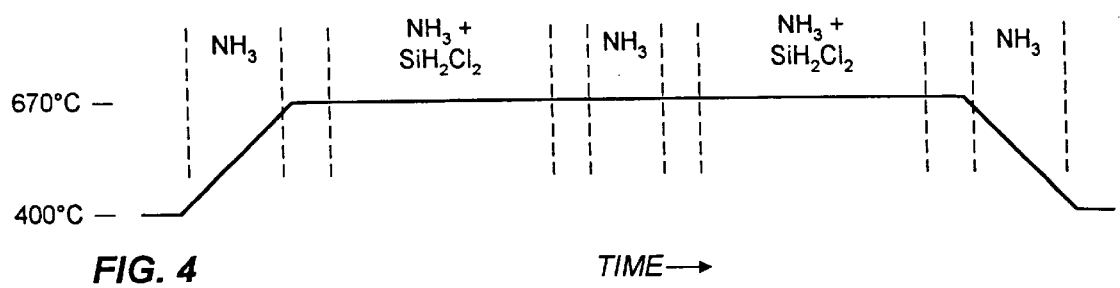
FIG. 4 schematically illustrates a series of processing steps that may be used in the formation of an ONONO dielectric structure.

Referring to FIG. 5, the processing steps in forming the seven layer ONONONO structure include all of the processing steps illustrated in FIG. 4, with an additional sequence of interrupting the growth of the second silicon nitride layer 36, purging and then reinitiating growth of a third layer of silicon nitride prior to ramping down the temperature of the furnace. The FIG. 5 process continues from the step of forming the second silicon nitride layer 36 by interrupting the flow of $NH_3$ and $SiH_2Cl_2$ gases to the furnace with a flow of nitrogen gas, purging the furnace with $NH_3$ (180 sccm) and preferably forming a third layer of silicon oxide 62 (FIG. 6) on the second silicon nitride layer 36. Here again, it is preferred that the interruption in the growth of the second silicon nitride layer 36 combined with the formation of the third silicon oxide layer 62 be sufficient so that any defect structures present in subsequently grown third silicon nitride layer 64 will be distributed at locations independent of the defect structures in the underlying second silicon nitride layer 36. After the third silicon oxide layer 62 is grown, the purge is stopped, nitrogen gas is provided to the furnace and the third silicon nitride layer 64 is grown by reintroducing a flow of $NH_3$ (180 sccm) and $SiH_2Cl_2$ (18 sccm) to the furnace, as illustrated in FIG. 5. The gas flow to the furnace is maintained to grow the third silicon nitride layer 64 to the desired thickness, with the thickness of each silicon nitride layer in the FIG. 6 structure typically being about equal and chosen to provide a dielectric structure having the desired total thickness. After the third silicon nitride layer is formed, a nitrogen purge (180 sccm) is provided and the temperature of the furnace is ramped down from the preferred nitride deposition temperature of 670° C. to 400° C. The substrates are removed from the furnace and surface oxide layer 66 is grown in a steam or wet $O_2$ environment, usually in a different furnace than the one used for nitride growth, at a temperature of about 850° C. for 15–30 minutes. Doped polysilicon is deposited on the surface oxide layer 66 and the doped polysilicon is patterned to form the upper electrode 14, completing the portion of the capacitor structure illustrated in FIG. 6.

Figure 7:
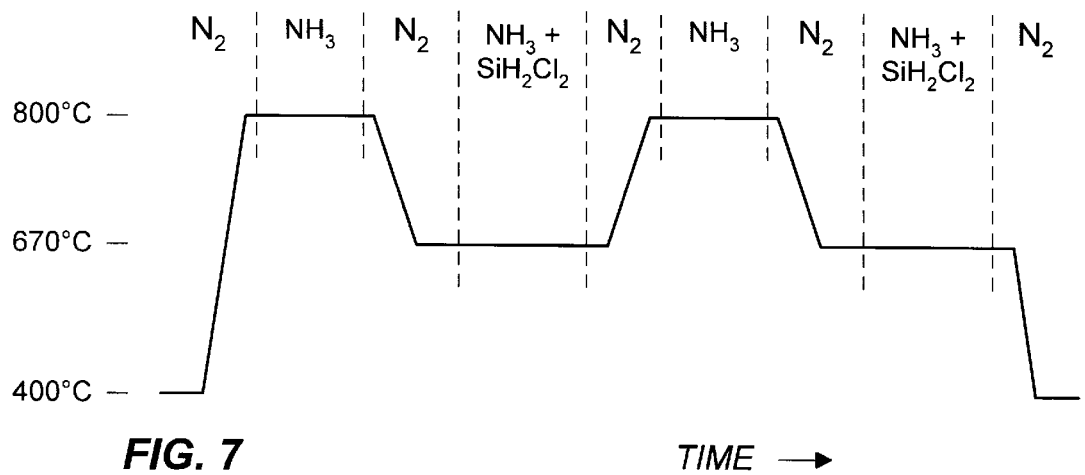
FIGS. 7 & 8 schematically illustrate other methods of forming an ONONO dielectric structure.

Another method of making an ONONO dielectric structure, or other more complicated dielectric structures, is illustrated in FIG. 7. The initial temperature ramp performed in the FIG. 7 process raises the furnace and substrate temperature from the preheat temperature of 400° C. to a temperature of 800° C. in a nitrogen ambient. The furnace and substrate temperature are stabilized at 800° C. and then an $NH_3$ gas purge is introduced by flowing $NH_3$ into the furnace at a rate of 1000 sccm with a chamber pressure of 1.2 Torr. The lowest silicon oxide layer 30 produced by this process is only about 5 Å thick and is generally more uniform than the oxide produced by the process illustrated in FIGS. 4 & 5. In general, the structure formed by the process illustrated in FIG. 7 will be similar to the structure illustrated in FIG. 2, with the exception that the first and second silicon oxide layers formed by the FIG. 7 process will be thinner and more uniform than the corresponding silicon oxide layers formed by the FIG. 4 process. The thinner, more uniform oxide layer 30 produced by the FIG. 7 method is desirable as increasing the effective dielectric constant of the dielectric structure and as improving the reliability of the dielectric structure.

After growth of the first oxide layer, a flow of nitrogen gas is introduced and then the temperature of the furnace is ramped down to a temperature of 670° C. and allowed to stabilize in preparation for growing silicon nitride. A mixture of $NH_3$ (180 sccm) and $SiH_2Cl_2$ (18 sccm) gases is once again provided to the reaction chamber, the chamber pressure is stabilized at about 100 mTorr and silicon nitride layer 32 is grown. In the FIG. 7 embodiment, growth of the first silicon nitride layer 32 is interrupted by halting the flow of $NH_3$ and $SiH_2Cl_2$ gas to the furnace, preferably by providing a flow of nitrogen gas to the furnace. The temperature of the furnace is then ramped from 670° C. up to 800° C. and allowed to stabilize. Once the furnace temperature stabilizes at 800° C., an $NH_3$ purge is provided to the furnace by flowing $NH_3$ gas at 1000 sccm to establish a chamber pressure of about 1.2 Torr. A thin (approximately 5 Å), uniform silicon oxide layer 34 is provided on the surface of the first silicon nitride layer 32 in this step. The flow of ammonia is stopped, the furnace is provided with a nitrogen flow and the furnace temperature is ramped down from 800° C. to 670° C. and allowed to stabilize. The mixture of $NH_3$ (180 sccm) and $SiH_2Cl_2$ (18 sccm) gases is then flowed into the chamber to grow a second layer of silicon nitride 36 on the second silicon oxide layer 34. The furnace temperature is ramped down from 670° C. to 400° C. in a nitrogen flow and the substrates are removed from the furnace. The surface oxide layer 38 is formed by another thermal process, preferably in another furnace, by heating the substrates to a temperature of about 850° C. for 15–30 minutes in a steam or wet $O_2$ environment. The surface oxide layer 38 may be about 10–30 Å thick. Further processing continues by depositing polysilicon on the upper silicon oxide layer 38, typically in a low pressure chemical vapor deposition (LPCVD) system, to form at least part of upper electrode 14. Variations on the process illustrated in FIG. 7 include forming further repetitions of the silicon nitride/silicon oxide structure by introducing additional sequences of nitride growth followed by a temperature ramp up and exposure to an $NH_3$ purge.

Figure 8:
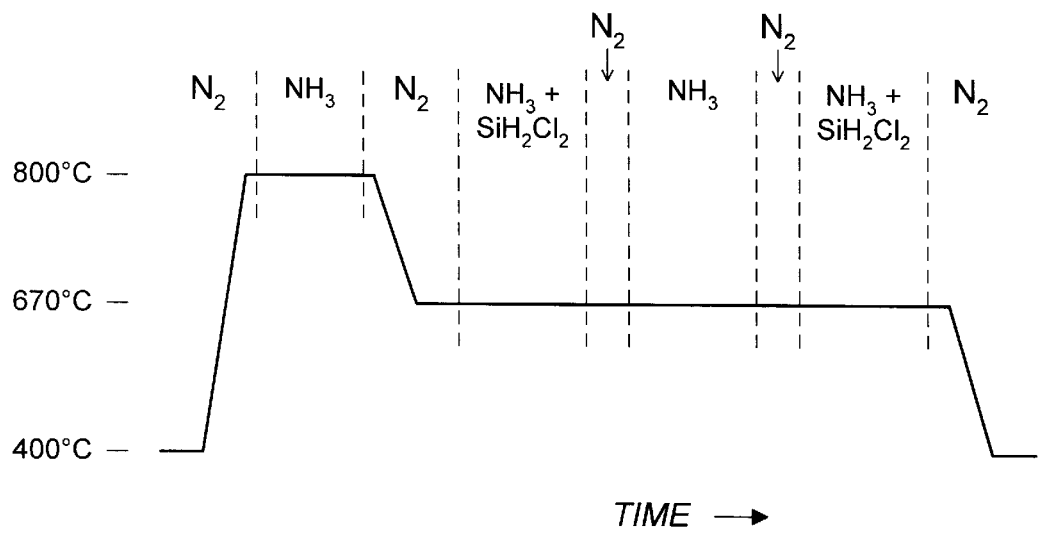

The use of multiple temperature ramps in the FIG. 7 method produces the most preferred dielectric structures in accordance with the present invention. However, the use of such multiple temperature ramps, including the need to wait for the furnace chamber temperature to stabilize before further processing, can make the FIG. 7 process undesirably lengthy. To improve throughput, it may be desirable to alter the FIG. 7 method as illustrated in FIG. 8. As illustrated, the FIG. 8 method utilizes the preferred initial ramp up to 800° C. for the growth of the first silicon oxide layer 30, but then performs the subsequent nitride and oxide growth steps at the preferred nitride deposition temperature of 670° C. Thus, while the FIG. 8 method will not produce as thin and as uniform of a silicon oxide layer as the method illustrated in FIG. 7, the FIG. 8 process can be performed faster since there is no need to wait for temperature ramps and temperature stabilization in the FIG. 8 process after the growth the initial silicon oxide layer.

Figure 9:
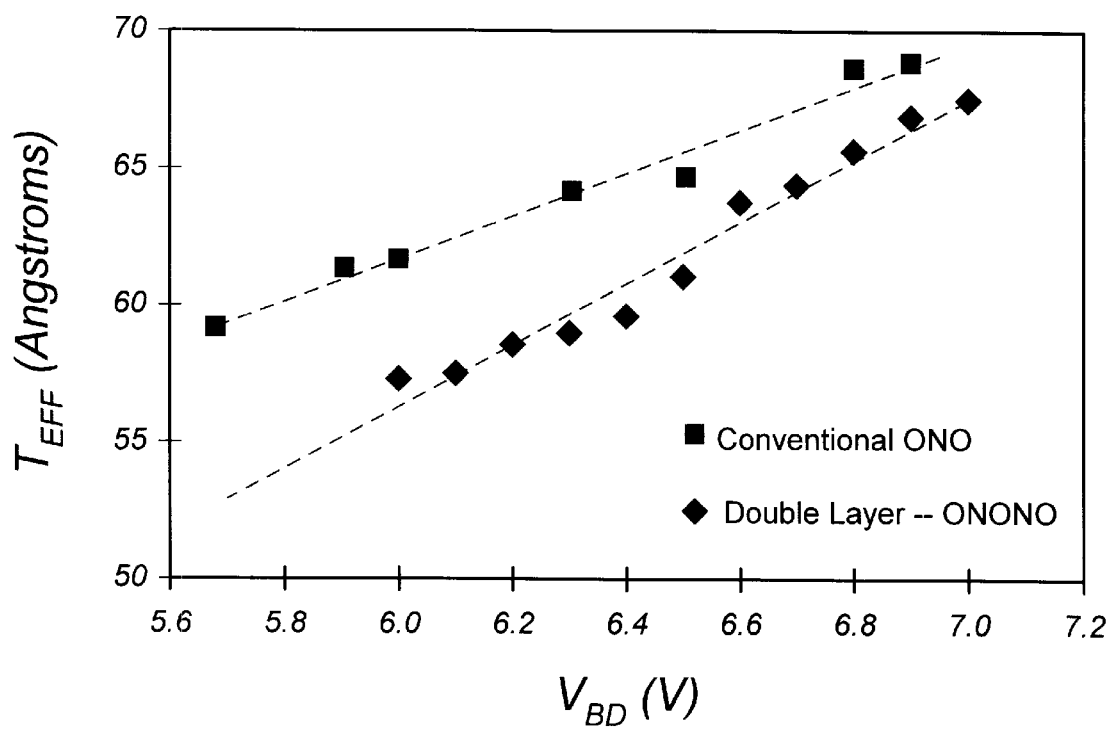
FIG. 9 graphically illustrates the improvements in breakdown voltage associated with preferred embodiments of the present invention.

FIG. 9 illustrates the improved breakdown voltage observed for a five layer ONONO dielectric structure in accordance with the present invention as compared to the conventional ONO dielectric structure. The X axis indicates the breakdown voltage in volts and the Y axis indicates the thickness of the dielectric structure as measured in angstroms of equivalent silicon oxide thickness, the conventional measure of dielectric thickness in integrated circuit devices. The data points for the conventional ONO structure are grouped above the data points for the five layer ONONO structure. This relationship illustrates that a thinner ONONO structure is necessary to achieve a desired level of breakdown voltage as compared to the conventional ONO structure. That is, a thinner ONONO dielectric structure has the same breakdown characteristics as a thicker ONO dielectric structure. $T_{EFF}$ of an ONONO dielectric structure in accordance with the present invention is thinner than that of the conventional ONO structure. Similarly, the capacitance of a given thickness of the invention's ONONO structure is larger than that of a given thickness of the conventional ONO structure. This result is somewhat surprising in that the five layer ONONO structure includes what might seem to be an unnecessary thickness of silicon oxide. It is apparent from the data, however, that other improvements in the dielectric structure account for the improvements in the breakdown voltage characteristics of the ONONO dielectric structure. As discussed above, the present inventors believe that the improved breakdown voltage of the five layer dielectric structure relates to a reduction in the number of defect structures that extend completely through most or all of the dielectric structure. Although not illustrated here, further repetitions of the silicon nitride/silicon oxide layer structure within the dielectric will result in further incremental improvements in the breakdown voltage.

Dielectric structures in accordance with preferred embodiments of the present invention find application in various integrated circuits where a high level of capacitive coupling is desired between two electrodes. This includes the capacitor dielectric in DRAM charge storage capacitors and within the charge storage nodes of SRAM devices. Other applications include providing a five or more layer dielectric structure between the control gate and the floating gate of EEPROM and flash EEPROM devices. Another application of the present invention is to the gate dielectric of thin film transistors (TFT) of the sort that are used as driving transistors for LCD flat panel displays. The drive transistors for such LCD devices consist of either amorphous silicon or polycrystalline silicon field effect transistors. Often, silicon nitride is used as the gate dielectric for the TFT drive transistors. The quality and uniformity of the gate dielectric is expected to be improved by introducing a three or more layer dielectric structure such as silicon nitride/silicon oxide/silicon nitride, ONONO or other of the dielectric structures described herein.

The present invention has been described with reference to particularly preferred embodiments thereof. Those of ordinary skill will, however, readily appreciate that variations of the structures and methods described herein can be made within the general theory of the present invention. Accordingly, the present invention is not to be limited to the particular embodiments described but instead the scope of the present invention is to be determined from the following claims.

What is claimed:

1. A method of forming a dielectric structure for an integrated circuit device, the method comprising:

providing a substrate to a processing chamber, the substrate having at least one first electrode with a surface exposed to a processing environment;

in the processing chamber, growing a first silicon nitride layer over the exposed surface of the first electrode;

in the processing chamber, forming a lower silicon oxide layer on the first electrode, the first silicon nitride layer in contact with the lower silicon oxide layer;

in the processing chamber forming an intermediate silicon oxide layer on the first silicon nitride layer, altering the processing environment within the processing chamber to interrupt the growth of the first silicon nitride layer;

in the processing chamber, reinitiating silicon nitride growth to grow a second silicon nitride layer over the first silicon nitride layer;

forming a surface oxide layer over the second silicon nitride layer; and forming a second electrode over the second silicon nitride layer and the surface of the oxide layer, wherein the lower and intermediate silicon oxide layers are formed by heating the substrate in an ambient including $NH_3$.

2. The method of claim 1, wherein the altering the processing environment comprises:

altering the processing environment from a gas mixture suitable for silicon nitride growth to a gas mixture not suitable for silicon nitride growth to stop growth of; and in the processing chamber, growing a silicon oxide layer over the first silicon nitride layer, wherein the second silicon nitride layer is grown on the silicon oxide layer.

3. The method of claim 1, wherein the lower silicon oxide layer is formed at a higher furnace temperature than is used for forming the first silicon nitride layer.

4. The method of claim 1, wherein the first silicon nitride layer is formed by heating the substrate in an ambient of $NH_3$ and $SiH_2Cl_2$.

5. The method of claim 4, wherein the first silicon nitride layer is formed at a temperature of abut 670° C.

6. The method of claim 1, wherein the lower silicon oxide layer is formed at a temperature of about 800° C.

7. The method of claim 5, wherein the lower silicon oxide layer is formed at a temperature of about 800° C.

* * * * *